United States Patent
Park et al.

(10) Patent No.: US 10,305,431 B2
(45) Date of Patent: May 28, 2019

(54) NOISE CANCELLING BASEBAND AMPLIFIER

(71) Applicant: QUALCOMM Incorporated, San Diego, CA (US)

(72) Inventors: Joung Won Park, San Diego, CA (US); Namsoo Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/723,059

(22) Filed: Oct. 2, 2017

(65) Prior Publication Data

US 2018/0026584 A1 Jan. 25, 2018

Related U.S. Application Data

(63) Continuation of application No. 14/876,524, filed on Oct. 6, 2015, now Pat. No. 9,780,734.

(51) Int. Cl.
| | |
|---|---|
| *H03F 3/45* | (2006.01) |
| *H03F 1/26* | (2006.01) |
| *H03F 3/19* | (2006.01) |
| *H03F 3/68* | (2006.01) |

(52) U.S. Cl.
CPC ............. *H03F 1/26* (2013.01); *H03F 3/19* (2013.01); *H03F 3/45071* (2013.01); *H03F 3/45475* (2013.01); *H03F 3/68* (2013.01); *H03F 2200/135* (2013.01); *H03F 2200/451* (2013.01); *H03F 2203/45138* (2013.01); *H03F 2203/45528* (2013.01)

(58) Field of Classification Search
CPC ........................................ H03F 3/45
USPC ............................... 330/69, 252, 260
See application file for complete search history.

(56) References Cited

U.S. PATENT DOCUMENTS

| | | | |
|---|---|---|---|
| 3,629,719 A | 12/1971 | Heller et al. | |
| 5,095,282 A * | 3/1992 | Dayton | H03F 3/347 330/258 |
| 5,300,896 A | 4/1994 | Suesserman | |
| 6,566,946 B2 * | 5/2003 | Llewellyn | H03F 1/26 330/69 |
| 6,577,187 B1 | 6/2003 | Lesko | |

(Continued)

FOREIGN PATENT DOCUMENTS

WO 0041297 A1 7/2000

OTHER PUBLICATIONS

Bruccoleri F., et al., "Wide-Band CMOS Low-Noise Amplifier Exploiting Thermal Noise Canceling", IEEE Journal of Solid-State Circuits, IEEE Service Center, Piscataway, NJ, USA, vol. 39, No. 2, Feb. 1, 2004 (Feb. 1, 2004), pp. 275-282, XP011106496, ISSN: 0018-9200, DOI: DOL10.1109/JSSC.2003.821786.

(Continued)

*Primary Examiner* — Henry Choe
(74) *Attorney, Agent, or Firm* — Qualcomm Incorporated-Toler

(57) ABSTRACT

An apparatus includes a first amplifier having a first feedback resistance and an output configured to be coupled to a first input of a second amplifier having a second feedback resistance. The apparatus includes a third amplifier coupled to an input of the first amplifier and having an output configured to be coupled to a second input of the second amplifier.

21 Claims, 4 Drawing Sheets

(56) References Cited

U.S. PATENT DOCUMENTS

| | | |
|---|---|---|
| 6,624,693 B2 | 9/2003 | Yamashita |
| 7,190,217 B2 * | 3/2007 | Dai .......................... H03F 1/30 |
| | | 330/260 |
| 7,899,426 B2 | 3/2011 | Tasic et al. |
| 7,902,923 B2 | 3/2011 | Li et al. |
| 8,112,059 B2 | 2/2012 | Beffa |
| 8,138,830 B2 | 3/2012 | Bugyik |
| 8,138,835 B2 | 3/2012 | Zeng et al. |
| 8,229,043 B2 | 7/2012 | Wang et al. |
| 8,400,214 B2 * | 3/2013 | Draxelmayr .......... H03F 3/3022 |
| | | 330/259 |
| 8,593,216 B2 | 11/2013 | Zhang |
| 8,606,193 B2 | 12/2013 | Ko et al. |
| 8,803,602 B2 * | 8/2014 | Rey-Losada ............ H03F 1/565 |
| | | 330/261 |
| 8,988,145 B2 * | 3/2015 | Popescu .............. H03F 3/45076 |
| | | 330/69 |
| 2004/0061553 A1 | 4/2004 | Suzuki |
| 2005/0116773 A1 * | 6/2005 | Laletin ............... G01R 31/3004 |
| | | 330/69 |
| 2013/0271213 A1 | 10/2013 | Chung et al. |
| 2016/0380599 A1 * | 12/2016 | Chen ....................... H03F 1/301 |
| | | 330/296 |
| 2017/0099035 A1 | 4/2017 | Park et al. |

OTHER PUBLICATIONS

International Search Report and Written Opinion—PCT/US2016/052238—ISA/EPO—dated Nov. 29, 2016, 15 pages.

Neu T., "Direct RF Conversion: From Vision to Reality," May 2015, 9 Pages.

Wangtaphan S., et al., "A 1.0 volt thermal noise-canceling CMOS transimpedance-based amplifier," Circuits and Systems, 2008, APCCAS 2008, IEEE Asia Pacific Conference on, IEEE, Piscataway, NJ, USA, Nov. 30, 2008 (Nov. 30, 2008), pp. 692-695, XP031405091, ISBN: 978-1-4244-2341-5.

* cited by examiner

NOISE CANCELLING BASEBAND AMPLIFIER

I. CROSS-REFERENCE TO RELATED APPLICATIONS

The present application claims priority from and is a continuation application of pending U.S. patent application Ser. No. 14/876,524, filed Oct. 6, 2015 and entitled "NOISE CANCELLING BASEBAND AMPLIFIER," the contents of which are expressly incorporated herein by reference in their entirety.

II. FIELD

The present disclosure is generally related to electronics, and more specifically to wireless communication devices.

III. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities and may support increasing wireless communication capability, particularly in downlink communications that provide information to the wireless telephones.

Wireless telephones may use radio frequency (RF) components to transmit and to receive wireless signals. Flicker noise introduced by a radiofrequency (RF) baseband filter (BBF) increases as transistor channel length of an input device is reduced (e.g. in deep submicron technology). For direct-conversion RF architectures (in a receiver), the flicker noise is particularly pertinent. Conventionally, a low-intermediate frequency (low-IF) architecture can be used to avoid flicker noise, but low-IF circuits introduce image noise into the IF signal. Alternatively, flicker noise can be reduced by using a large PMOS input device, which increases area used by the RF system and reduces bandwidth of the filter.

IV. BRIEF DESCRIPTION OF THE DRAWINGS

V. DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1:
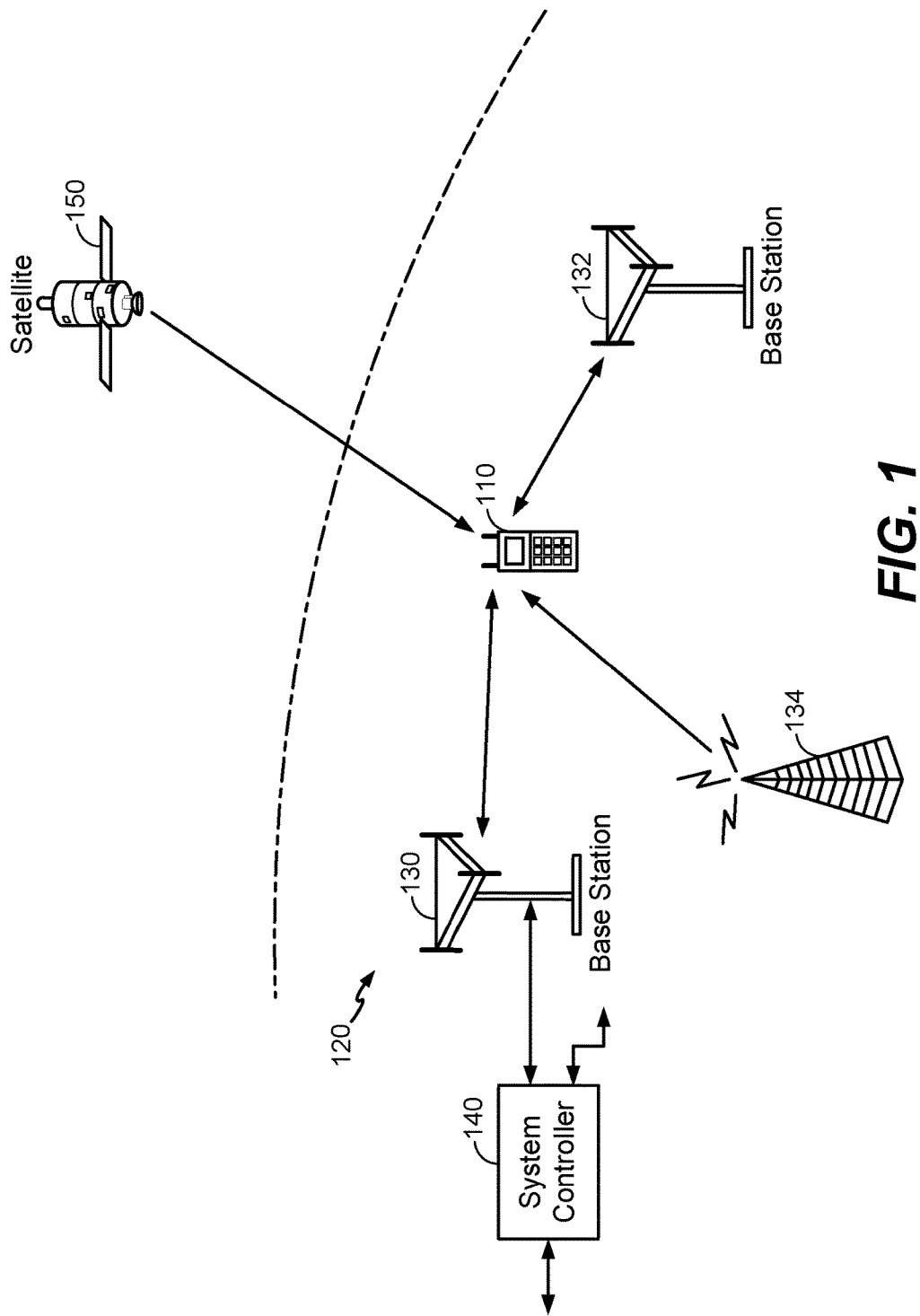
FIG. 1 shows a wireless device that includes a noise cancelling baseband amplifier, the wireless device communicating with a wireless system.

FIG. 1 shows a wireless device 110 communicating with a wireless communication system 120. Wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless system may include any number of base stations and any set of network entities.

Wireless device 110 may also be referred to as user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication, such as LTE, WCDMA, CDMA 1x, EVDO, TD-SCDMA, GSM, 802.11, etc. Further, in an exemplary embodiment, the wireless device 110 includes a noise cancelling baseband amplifier, which is described in further detail with respect to FIG. 2 and FIG. 3.

Figure 2:
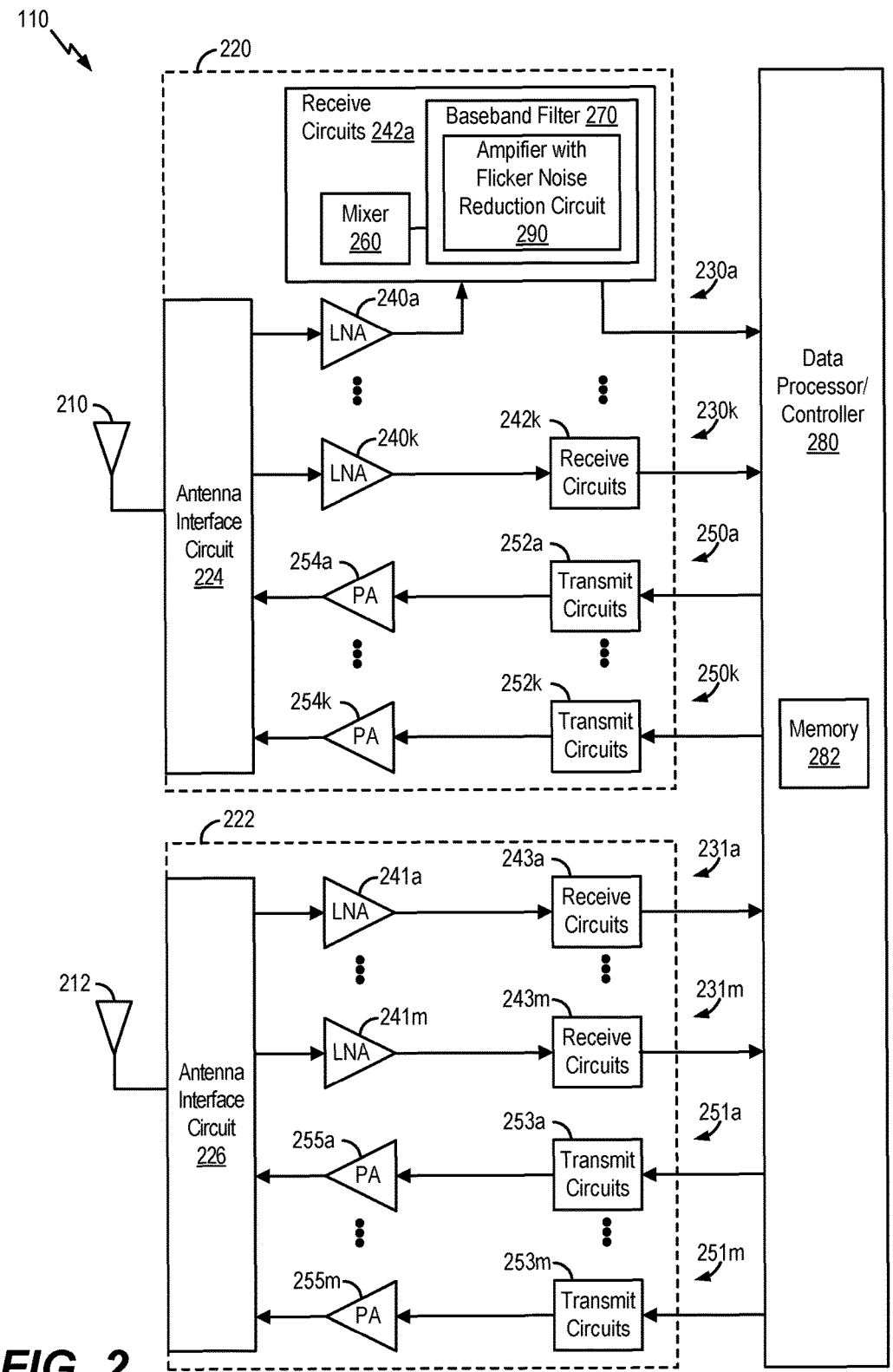
FIG. 2 shows a block diagram of the wireless device in FIG. 1 that includes a noise cancelling baseband amplifier.

FIG. 2 shows a block diagram of an exemplary design of the wireless device 110 in FIG. 1. In this exemplary design, wireless device 110 includes a transceiver 220 coupled to a primary antenna 210 via an antenna interface circuit 224, a transceiver 222 coupled to a secondary antenna 212 via an antenna interface circuit 226, and a data processor/controller 280. Transceiver 220 includes multiple (K) receivers 230a to 230k and multiple (K) transmitters 250a to 250k to support multiple frequency bands, multiple radio technologies, carrier aggregation, etc. Transceiver 222 includes multiple (M) receivers 231a to 231m and multiple (M) transmitters 251a to 251m to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230a to 230k and 231a to 231m includes one of the LNAs 240a to 240k or 241a to 241m that is configured to provide an RF signal to one of the receive circuits 242a to 242k or 243a to 243m. For data reception, antenna 210 receives signals from base stations and/or other transmitter stations and provides a received RF signal, which is routed through the antenna interface circuit 224. Antenna interface circuit 224 may include switches, duplexers, transmit filters, receive filters, matching circuits, etc. An output of the antenna interface circuit 224 is presented as an input RF signal to one or more of the receivers 230a to 230k, such as via a first input signal path to receiver 230a or via a second input signal path to receiver 230k. Within the one or more of the receivers 230a to 230k, the input RF signal is amplified and provided to the respective one or more receive circuits 242a to 242k.

Figure 3:
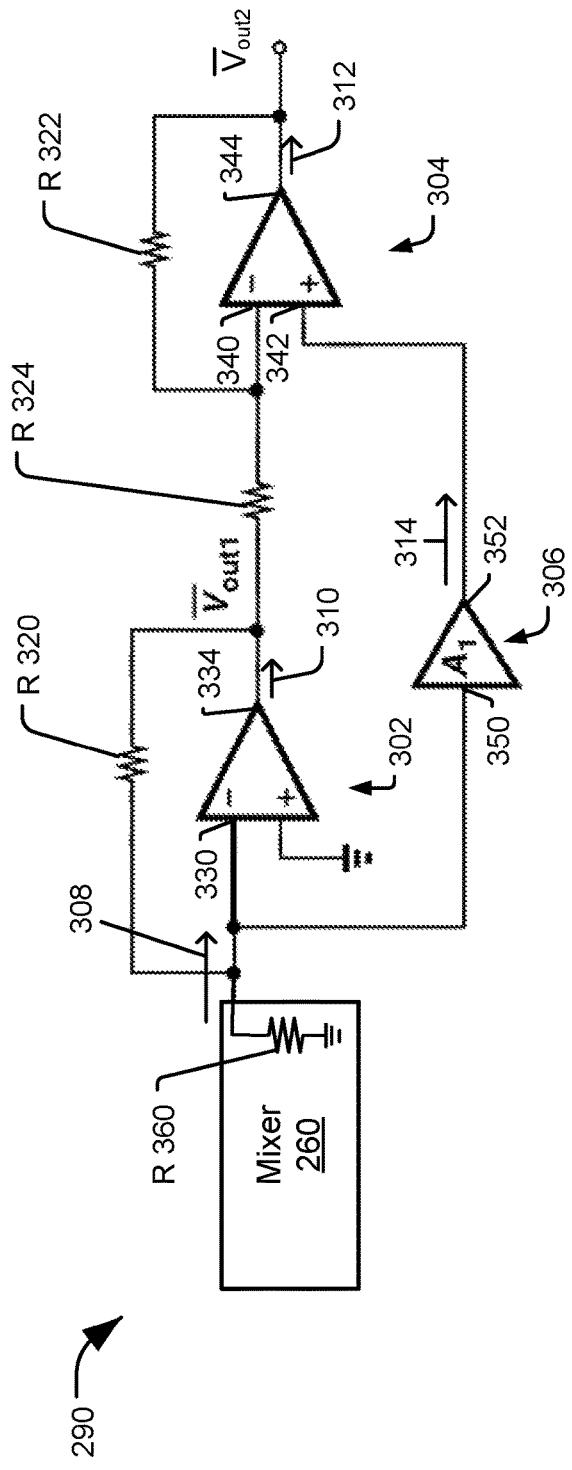
FIG. 3 shows a block diagram of an exemplary embodiment of components including a noise cancelling baseband amplifier that may be included in the wireless device of FIG. 1.

The description below assumes that receiver 230a is selected to receive an RF signal. The RF signal is received from the antenna 210 via the antenna interface circuit 224 and is provided to the LNA 240a. An amplified RF signal is generated by the LNA 240a. Receive circuits 242a downconvert the amplified RF signal, amplify and filter the downconverted signal, and provide an analog input signal to data processor/controller 280. Receive circuits 242a may include mixers, filters, amplifiers, matching circuits, an oscillator, a local oscillator (LO) generator, a phase locked loop (PLL), etc. As illustrated, the receive circuits 242a include a mixer 260 and a baseband filter 270. The baseband filter 270 includes an amplifier with a flicker reduction circuit 290. An illustrative embodiment of the amplifier 290 is illustrated in FIG. 3. In an exemplary implementation, the amplifier 290 is an apparatus that includes a first amplifier having a first feedback resistance and an output configured to be coupled to a first input of a second amplifier having a second feedback resistance. The amplifier 290 further includes a third amplifier coupled to an input of the first amplifier and having an output configured to be coupled to a second input of the second amplifier. Each of the receivers 230a to 230k and 231a to 231m in transceivers 220 and 222 may include a baseband filter that includes a flicker noise reduction circuit and may operate in a similar manner as receiver 230a.

In the exemplary design shown in FIG. 2, each of the transmitters 250a to 250k and 251a to 251m includes one of the transmit circuits 252a to 252k and 253a to 253m and one of the power amplifiers (PAs) 254a to 254k and 255a to 255m. For data transmission, data processor/controller 280 processes (e.g., encodes and modulates) data to be transmitted and provides an analog output signal to a selected transmitter. The description below assumes that transmitter 250a is the selected transmitter to transmit a RF signal. Within transmitter 250a, transmit circuits 252a amplify, filter, and upconvert the analog output signal from baseband to RF and provide a modulated RF signal. Transmit circuits 252a may include amplifiers, filters, mixers, matching circuits, an oscillator, an LO generator, a PLL, etc. A PA 254a receives and amplifies the modulated RF signal and provides a transmit RF signal having the proper output power level. The transmit RF signal is routed through antenna interface circuit 224 and transmitted via antenna 210. Each of the transmitters 250a to 250k and 251a to 251m in transceivers 220 and 222 may operate in a similar manner as transmitter 250a.

FIG. 2 shows an exemplary design of receivers 230a to 230k and 231a to 231m and transmitters 250a to 250k and 251a to 251m. A receiver and a transmitter may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240a to 240k and 241a to 241m and receive circuits 242a to 242k and 243a to 243m may be implemented on one module, which may be an RFIC, etc.

Data processor/controller 280 may perform various functions for wireless device 110. For example, data processor/controller 280 may perform processing for data received via receivers 230a to 230k and 231a to 231m and data to be transmitted via transmitters 250a to 250k and 251a to 251m. Data processor/controller 280 may control the operation of the various circuits within transceivers 220 and 222. A memory 282 may store program code and data for data processor/controller 280. Data processor/controller 280 may be implemented on one or more application specific integrated circuits (ASICs) and/or other ICs.

Wireless device 110 may support multiple band groups, multiple radio technologies, and/or multiple antennas. Wireless device 110 may include a number of LNAs to support reception via the multiple band groups, multiple radio technologies, and/or multiple antennas. Exemplary embodiments of components that may be used in the wireless device 110 are described in further detail with respect to FIG. 3.

FIG. 3 illustrates an exemplary embodiment of an amplifier that includes a noise canceling RF receive circuit 290 that includes a first amplifier 302 (e.g., a transimpedance amplifier (TIA)) coupled to a second amplifier 304 (e.g., a programmable baseband amplifier (PBA)). The first amplifier 302 is configured to amplify an input signal 308 (e.g., a baseband signal converted from an input RF signal received from mixer 260) received at an input 330 to the first amplifier 302 and to generate an amplified signal 310 at an output 334 of the first amplifier 302. The output 334 of the first amplifier 302 is coupled to a first input 340 (e.g., an inverting input) of the second amplifier 304. The second amplifier 304 is configured to receive the amplified signal 310 at the first input 340 and to generate an output signal 312 at an output 344 of the second amplifier 304. A third amplifier 306 has an input 350 coupled to receive the input signal 308. The third amplifier 306 is configured to generate a noise cancelling signal 314 at an output 352 of the third amplifier 306. The output 352 of the third amplifier 306 is coupled to a second input 342 (e.g., a non-inverting input) of the second amplifier 304. The third amplifier 306 captures flicker noise generated by the first amplifier 302 and is configured to enable the flicker noise to be cancelled (or reduced) at the second amplifier 304.

The first amplifier 302 is configured to receive the input signal 308 from the mixer 260. The mixer 260 may be modeled as a current source with a current (Iin) and a resistance (Rmix). The first amplifier 302 amplifies the input signal 308 and generates the amplified signal 310. The amplified signal 310 has approximately a 180 degree phase shift relative to the input signal 308. The first amplifier 302 introduces flicker noise into the amplified signal 310. The amplified signal 310 including the flicker noise is fed back to the input 330 of the first amplifier 302 via a feedback resistor R 320.

The third amplifier 306 amplifies the input signal 308 including the flicker noise to generate the noise cancelling signal 314. The gain of the third amplifier 306 may be set such that the amplitude (and phase) of the flicker noise substantially equals the amplitude (and phase) of the flicker noise in the amplified signal 310. A formula for calculating the gain ($A_1$) of the third amplifier 306 is as follows:

$$\overline{V_{out1}} = \left(1 + \frac{R_F}{R_{mix}}\right)\overline{V_{N,OP}} \quad \text{(Equation 1)}$$

$$\overline{V_{out2}} = A_1 \overline{V_{N,OP}} + \frac{A_1 \overline{V_{N,OP}} - \overline{V_{out1}}}{R_1} R_2 \quad \text{(Equation 2)}$$

Setting $\overline{V_{out2}}=0$, the gain $A_1$ of the third amplifier 306 may be represented as:

$$A_1 = \frac{\left(1 + \frac{R_F}{R_{mix}}\right)}{\left(1 + \frac{R_1}{R_2}\right)}. \quad \text{(Equation 3)}$$

In equations 1-3, $\overline{V_{out1}}$ represents a voltage at the output 334 of the first amplifier 302, RF represents the resistance of the resistor R 320, $R_{mix}$ represents the output resistance R 360 of the mixer 260, $\overline{V_{N,OP}}$ represents flicker noise at the input 330 of the first amplifier 302 (e.g., a flicker noise feedback signal from the output 334 of the first amplifier 302), $\overline{V_{out2}}$ represents a voltage at the output 344 of the second amplifier 304, $R_1$ represents the resistance of a resistor R 324 coupled to the output 334 of the first amplifier 302 and to the input 340 of the second amplifier 304, and $R_2$ represents the resistance of the resistor R 322.

The second amplifier 304 receives the amplified signal 310 at the first input 340 (e.g., an inverting input) and the noise cancelling signal 314 at the second input 342 (e.g., a non-inverting input). A feedback device R 322 coupled between the output 344 of the second amplifier 304 and the first input 340 sets the gain of the second amplifier 304. The second amplifier 304 cancels (or substantially reduces) the flicker noise at the output signal 312.

Because a gain of the first amplifier 302 (e.g., 60-70 dB) may be substantially larger than the gain $A_1$ of the third amplifier 306, a signal magnitude at the first input 340 of the second amplifier 304 is significantly greater than a signal magnitude at the second input 342 of the second amplifier 304, resulting in insubstantial signal loss due to the flicker noise cancellation. Thus, the noise cancelling signal 314 generated by the third amplifier 306 may be used to cancel flicker noise introduced by the first amplifier 302 to generate the output signal 312 with substantially reduced flicker noise. Cancelling flicker noise via the noise cancelling signal 314 enables low-noise implementations using direct-conversion architectures with reduced complexity as compared to implementations that use low-IF signal processing to avoid flicker noise, and also enables using smaller transistor sizes as compared to implementations that use large transistors to reduce flicker noise.

Figure 4:
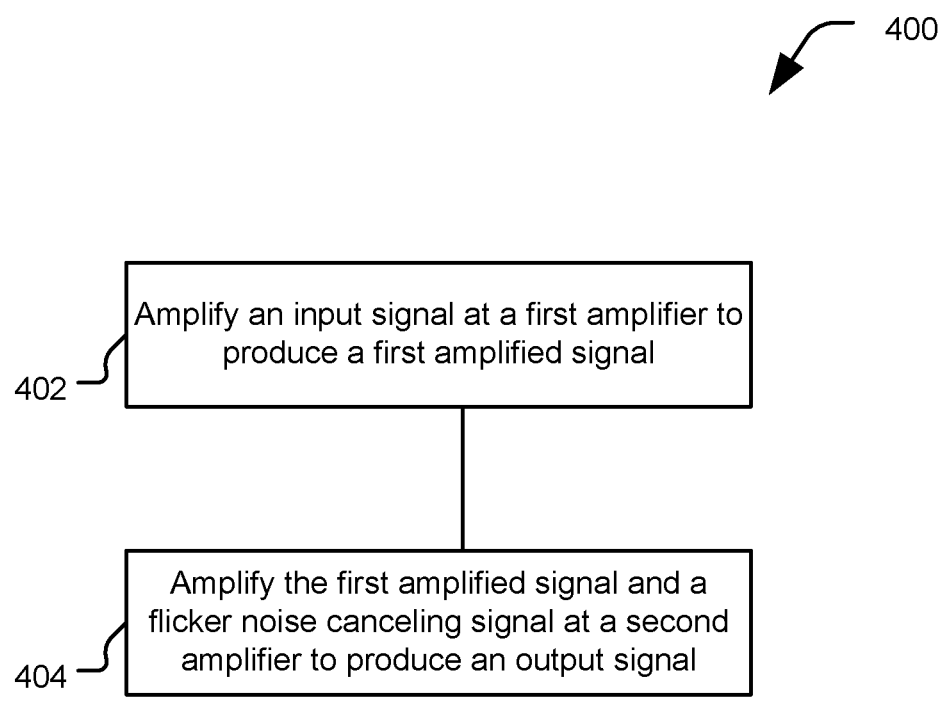
FIG. 4 illustrates a flowchart of a method that may be performed by the wireless device of FIG. 1.

Referring to FIG. 4, a particular exemplary embodiment of a method 400 of processing signals is shown. The method 400 includes amplifying an input signal at a first amplifier to produce a first amplified signal, at 402. For example, an input signal 308 is received at the first amplifier 302 and is amplified to produce the amplified signal 310 at the output 334 of the first amplifier 302. The method further includes amplifying the first amplified signal and a flicker noise canceling signal at a second amplifier to produce an output signal. For example, the first amplified signal 310 from the first amplifier 302 is provided to an inverting input 340 of the second amplifier 304. The flicker noise canceling signal 314 from the third amplifier 306 is provided to a positive input 342 of the second amplifier 304. The second amplifier 304 amplifies the first amplified signal 310 and the flicker noise canceling signal 314 to produce the output signal 312. Thus, a method of processing signals at a multistage amplifier where the signal processing includes flicker noise cancellation, or flicker noise reduction, is illustrated. In a particular illustrative example, the third amplifier 306 has a gain that is based on a first feedback resistance of the first amplifier 302 and a second feedback resistance of the second amplifier 304. For example, the gain of the amplifier 306 is based on the first feedback resistance R 320 and the second feedback resistance R 322, as shown in FIG. 3.

In an illustrative implementation, by using the amplifier including the flicker noise cancellation circuit 290 in the receive chain of a GSM receiver, a noise figure improvement of 1 dB may be attained in a low frequency noise range (e.g., 5 kHz-100 kHz). As a result, large PMOS input devices may be omitted to reduce circuit area (e.g., by 100 um×100 um). Thus, the circuit 290 may be used to reduce low frequency noise in a baseband amplifier without requiring large PMOS input devices.

In accordance with the above-described implementations, an apparatus includes first means for amplifying. For example, the first means for amplifying may include the first amplifier 302 of FIG. 3, one or more other amplifiers or other circuits configured to amplify an input signal, or any combination thereof. The first means for amplifying includes a first means for resisting. For example, the first means for resisting may include the resistor R 320 of FIG. 3, one or more other resistors or other circuit elements configured to resist or impede current flow, or any combination thereof. In a particular example, the first means for amplifying may include means for trans-impedance amplifying, such as a trans-impedance amplifier (TIA) (e.g., TIA 302).

The first means for amplifying has an output configured to be coupled to a first input of second means for amplifying. For example, the second means for amplifying may include the second amplifier 304 of FIG. 3, one or more other amplifiers or other circuits configured to amplify an input signal, or any combination thereof. The second means for amplifying includes second means for resisting. For example, the second means for resisting may include the resistor R 322 of FIG. 3, one or more other resistors or other circuit elements configured to resist or impede current flow, or any combination thereof. In a particular example, the second means for amplifying may include means for programmably amplifying a baseband signal, such as a programmable baseband amplifier (e.g., BA 304).

The apparatus includes third means for amplifying coupled to an input of the first means for amplifying and having an output configured to be coupled to a second input of the second means for amplifying. For example, the third means for amplifying may include the third amplifier 306 of FIG. 3, one or more other amplifiers or other circuits configured to amplify an input signal, or any combination thereof.

Those of skill in the art would understand that information and signals may be represented using any of a variety of different technologies and techniques. For example, data, instructions, commands, information, signals, bits, symbols, and circuits that may be referenced throughout the above description may be represented by voltages, currents, electromagnetic waves, magnetic fields or particles, optical fields or particles, or any combination thereof.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
   a low noise amplifier;
   a mixer coupled to the low noise amplifier and configured to receive a signal output by the low noise amplifier;
   a first differential amplifier having an inverting input configured to receive an input signal from the mixer and having an output configured to be coupled to an inverting input of a second differential amplifier; and
   a single-ended amplifier having an input coupled to the first input of the first differential amplifier and having an output configured to be coupled to a non-inverting input of the second differential amplifier, the single-ended amplifier configured to receive the input signal.

2. The apparatus of claim 1, wherein the first differential amplifier is coupled to a first feedback resistor, wherein the second differential amplifier is coupled to a second feedback resistor, and wherein the single-ended amplifier has a gain based on an input resistance to the first differential amplifier, an input resistance to the second differential amplifier, a first feedback resistance of the first feedback resistor and a second feedback resistance of the second feedback resistor.

3. The apparatus of claim 1, wherein the input of the single-ended amplifier is connected to the first input.

4. The apparatus of claim 1, wherein the first differential amplifier includes a trans-impedance amplifier having a non-inverting input coupled to ground.

5. The apparatus of claim 1, wherein the single-ended amplifier has one input terminal, the input terminal configured to operate as the input and to receive the input signal, and wherein the second differential amplifier comprises a programmable baseband amplifier.

6. The apparatus of claim 2, wherein the input of the single-ended amplifier is connected to the first feedback resistor, and wherein the gain of the single-ended amplifier is less than a gain of the first differential amplifier.

7. The apparatus of claim 1, wherein the single-ended amplifier is configured to amplify a flicker noise signal from the first differential amplifier.

8. The apparatus of claim 7, wherein the second differential amplifier is configured to cancel flicker noise from the first differential amplifier based on the amplified flicker noise signal from the single-ended amplifier.

9. An apparatus comprising:
   means for amplifying, with low noise, signals;
   means for mixing signals, the means for mixing coupled to the means for amplifying to receive the amplified signals; and
   means for filtering received signals, the means for filtering coupled to the means for mixing to receive the mixed signals, and the means for filtering comprising:
      first means for amplifying including an inverting input configured to receive an input signal and including an output configured to be coupled to an inverting input of second means for amplifying; and
      third means for amplifying including an input coupled to the first input of the first means for amplifying and including an output coupled to a non-inverting input of the second means for amplifying, the third means for amplifying configured to receive the input signal.

10. The apparatus of claim 9, wherein the third means for amplifying has a gain based on a first means for resisting associated with the first means for amplifying and second means for resisting associated with the second means for amplifying.

11. The apparatus of claim 10, wherein the first means for amplifying is coupled, via a third means for resisting, to the inverting input of the second means for amplifying.

12. The apparatus of claim 9, wherein the first means for amplifying comprises means for trans-impedance amplifying.

13. The apparatus of claim 9, wherein the second means for amplifying comprises means for programmably amplifying a baseband signal.

14. The apparatus of claim 9, wherein the third means for amplifying has a gain that is less than a gain of the first means for amplifying.

15. The apparatus of claim 9, wherein the third means for amplifying is configured to amplify a flicker noise signal at the first input of the first means for amplifying.

16. The apparatus of claim 15, wherein the second means for amplifying includes means for canceling flicker noise from the first means for amplifying based on the amplified flicker noise signal from the third means for amplifying.

17. A method of processing signals, the method comprising:
    performing, at a low noise amplifier, a low noise amplification operation on a signal to generate an input signal;
    amplifying the input signal at a first differential amplifier to produce a first amplified signal that is provided to an inverting input of a second differential amplifier, the input signal received at an inverting input of the first differential amplifier;
    amplifying the input signal at a single-ended amplifier to produce a flicker noise canceling signal that is provided to a non-inverting input of the second differential amplifier, wherein the single-ended amplifier receives the input signal at an input coupled to a first input of the first differential amplifier; and
    amplifying the first amplified signal and the flicker noise canceling signal at the second differential amplifier to produce an output signal.

18. The method of claim 17, further comprising mixing the input signal prior to amplifying the input signal at the first differential amplifier and at the single-ended amplifier.

19. The method of claim 17, wherein the input of the single-ended amplifier further receives a flicker noise signal from the first differential amplifier.

20. The method of claim 19, further comprising amplifying the flicker noise signal at the single-ended amplifier to produce the flicker noise canceling signal.

21. The apparatus of claim 1, wherein the low noise amplifier, mixer, first differential amplifier, second differential amplifier, and single-ended amplifier are included within a wireless device.

* * * * *